United States Patent
Nakamura et al.

(10) Patent No.: US 12,210,279 B2
(45) Date of Patent: Jan. 28, 2025

(54) ELECTROCONDUCTIVE-FILM-COATED SUBSTRATE AND REFLECTIVE MASK BLANK

(71) Applicant: AGC Inc., Tokyo (JP)

(72) Inventors: Sotaro Nakamura, Tokyo (JP);
Masayoshi Mizoguchi, Fukushima (JP);
Takeshi Tomizawa, Fukushima (JP);
Takahira Miyagi, Fukushima (JP);
Ryusuke Morita, Fukushima (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 17/664,682

(22) Filed: May 24, 2022

(65) Prior Publication Data

US 2022/0390825 A1    Dec. 8, 2022

(30) Foreign Application Priority Data

May 27, 2021    (JP) .................................. 2021-089510
Aug. 30, 2021    (JP) .................................. 2021-139521
Apr. 25, 2022    (JP) .................................. 2022-071912

(51) Int. Cl.
*G03F 1/24*    (2012.01)
*C03C 17/36*    (2006.01)
*G03F 1/54*    (2012.01)

(52) U.S. Cl.
CPC ................ *G03F 1/24* (2013.01); *C03C 17/36* (2013.01); *G03F 1/54* (2013.01)

(58) Field of Classification Search
CPC ...................... G03F 1/24; G03F 1/54
See application file for complete search history.

(56) References Cited

U.S. PATENT DOCUMENTS

| | | | |
|---|---|---|---|
| 2005/0238922 A1 | 10/2005 | Kinoshita et al. | |
| 2015/0301441 A1* | 10/2015 | Hamamoto | G03F 1/24 430/311 |
| 2023/0097280 A1* | 3/2023 | Nozawa | G03F 1/54 430/5 |

FOREIGN PATENT DOCUMENTS

| | | |
|---|---|---|
| JP | 2005-210093 A | 8/2005 |
| JP | 2005-316448 | 11/2005 |
| JP | 2016-92025 A | 5/2016 |
| JP | 2017-151483 A | 8/2017 |
| WO | 2014/021235 | 2/2014 |

OTHER PUBLICATIONS

Decision to Grant issued Jun. 23, 2023, in Japanese Patent Application No. 2022-071912, 5 pgs.

\* cited by examiner

*Primary Examiner* — Stewart A Fraser
(74) *Attorney, Agent, or Firm* — Oblon, McClelland, Maier & Neustadt, L.L.P.

(57) ABSTRACT

An electroconductive-film-coated substrate includes a glass substrate and an electroconductive film disposed on one main surface of the glass substrate. The electroconductive film has an inclined portion in a peripheral edge. A distance from a position in the inclined portion where a thickness of the electroconductive film is 10% of a film thickness of a center of the electroconductive film to an edge end of the glass substrate is 3.00 mm or less. A distance from an end of the inclined portion to the edge end of the glass substrate is longer than 0.00 mm.

6 Claims, 2 Drawing Sheets

ELECTROCONDUCTIVE-FILM-COATED SUBSTRATE AND REFLECTIVE MASK BLANK

TECHNICAL FIELD

The present invention relates to an electroconductive-film-coated substrate and a reflective mask blank.

BACKGROUND ART

With the recent trend toward miniaturization of integrated circuits as components of semiconductor devices, lithography employing extreme ultra violet (hereinafter referred to as "EUV") is being investigated as an exposure method which is expected to replace the conventional exposure technique employing visible light, ultraviolet light (wavelengths, 193-365 nm), ArF excimer laser light (wavelength, 193 nm), or the like.

In EUV lithography, EUV light, which has a shorter wavelength than ArF excimer laser light, is used as light for exposure. The term "EUV light" means light having a wavelength in a soft X-ray range or a vacuum ultraviolet range, specifically, light having a wavelength of about from 0.2 to 100 nm. For example, EUV light having a wavelength of about 13.5 nm is used.

EUV light is readily absorbed by various substances and, hence, the refractive optical systems which have been employed in conventional exposure techniques cannot be used therewith. Because of this, a catoptric system including a reflective mask, a mirror, etc. is used in EUV lithography. In EUV lithography, a reflective mask is used as a mask for transfer.

A mask blank is an unpatterned multilayer structure for use in photomask production. In the case of a reflective mask blank, this mask blank has a structure including a substrate made of, for example, a glass, a reflective layer for reflecting EUV light, and an absorption layer for absorbing EUV light, the reflective layer and the absorption layer having been formed over the substrate in this order. Usually employed as the reflective layer is a multilayer reflective film that is formed by alternately stacking a low-refractive-index layer, which has a low refractive index for EUV light, and a high-refractive-index layer, which has a high refractive index for EUV light, and that hence has a heightened light ray reflectance when EUV light is caused to strike on the layer surface. Molybdenum (Mo) layers are usually used as the low-refractive-index layers of the multilayer reflective film, and silicon (Si) layers are usually used as the high-refractive-index layers of the multilayer reflective film.

For the absorption layer, use is made of a material having a high coefficient of absorption of EUV light, for example, a material including chromium (Cr) or tantalum (Ta) as a main component.

The multilayer reflective film and the absorption layer are deposited over a main surface of a substrate using an ion beam sputtering method or a magnetron sputtering method. In depositing the multilayer reflective film and the adsorption layer, the glass substrate is held by a holding means. Although examples of the substrate-holding means include mechanical chucking and electrostatic chucking, it is preferable, from the standpoint of the problem of dusting, that adhesion holding by electrostatic chucking is used as a substrate-holding means in depositing the multilayer reflective film and the adsorption layer, especially as a substrate-holding means in depositing the multilayer reflective film.

Electrostatic chucking is a technique conventionally used for the adhesion holding of silicon wafers in semiconductor device production processes. Because of this, in the case of using substrates having a low permittivity and a low electrical conductivity, such as glass substrates, application of a high voltage is necessary for obtaining substantially the same chucking force as in the case of silicon wafers, resulting in the risk of dielectric breakdown.

In order to overcome such a problem, a technique is being employed in which an electroconductive film having a high permittivity is formed on the back surface of a substrate (the surface on the side opposite to the deposition surface of the substrate where the multilayer reflective film and the absorption layer are to be formed, the surface on the side where the adhesion holding is performed by electrostatic chucking).

There are cases where some of the electroconductive film peels off due to vibrations during electrostatic chucking or a contact with the clamp structure for electrostatic chucking. In the case where particles are released due to such electroconductive-film peeling during the electrostatic chucking, etc., the particles may, for example, inhibit attainment of a high-quality reflective mask in the step in which a mask pattern is formed in the reflective mask blank by electron beam irradiation, etc. to produce a reflective mask, or inhibit the attainment of high-accuracy transfer in the step of exposure with the reflective mask. In the case of pattern transfer with conventional transmissive masks for exposure, the exposure light has a relatively long wavelength (about 157-248 nm) in the ultraviolet region and, hence, even when the mask surfaces have recess/protrusion defects therein, these defects are less apt to be serious defects. Because of this, the generation of particles during film deposition has not been especially regarded as a problem. However, in the case where short-wavelength light such as EUV light is used as exposure light, even fine recess/protrusion defects in the mask surfaces considerably affect the transferred images and, hence, the generation of particles is not ignorable.

Patent Literature 1 describes a substrate with a multilayer reflective film, wherein an electroconductive film has been formed on the surface of the substrate on the side opposite from the multilayer reflective film in a region other than at least a peripheral portion and no electroconductive film has been formed on at least a chamfered surface and edge surfaces of the substrate. Patent Literature 1 states that due to that configuration, the generation of particles which may occur because of peripheral-portion film peeling in the case where an electroconductive film has been formed also in the peripheral portion of the substrate can be prevented and that even when the substrate warps during electrostatic chucking, particle generation from the peripheral portion of the substrate can be prevented.

CITATION LIST

Patent Literature

[Patent Literature 1] JP-A-2005-210093

SUMMARY OF INVENTION

Technical Problem

In the case where an electroconductive film has been formed on a substrate in a region other than at least a peripheral portion, as in the substrate with a multilayer reflective film described in Patent Literature 1, the generation of particles during electrostatic chucking may not be inhibited enough.

An object of the present invention is to provide a reflective mask blank inhibited from releasing particles during electrostatic chucking and an electroconductive-film-coated substrate for producing the mask blank.

Solution to Problem

The present inventors diligently made investigations and, as a result, have discovered that the problem can be overcome with the following configurations.

[1] An electroconductive-film-coated substrate including a glass substrate and an electroconductive film disposed on one main surface of the glass substrate,
wherein the electroconductive film has an inclined portion in a peripheral edge,
a distance from a position in the inclined portion where a thickness of the electroconductive film is 10% of a film thickness of a center of the electroconductive film to an edge end of the glass substrate is 3.00 mm or less, and
a distance from an end of the inclined portion to the edge end of the glass substrate is longer than 0.00 mm.

[2] The electroconductive-film-coated substrate according to [1] wherein the glass substrate has a chamfered surface in a peripheral edge portion of the main surface, and at least a part of the end of the inclined portion lies within the chamfered surface.

[3] The electroconductive-film-coated substrate according to [2] wherein all of the end of the inclined portion lies within the chamfered surface.

[4] The electroconductive-film-coated substrate according to any one of [1] to [3] wherein the position in the inclined portion where the thickness of the electroconductive film is 10% of the film thickness of the center of the electroconductive film does not lie within the chamfered surface.

[5] The electroconductive-film-coated substrate according to any one of [1] to [4] wherein the electroconductive film has a Young's modulus of 50.0 GPa or higher.

[6] The electroconductive-film-coated substrate according to any one of [1] to [5] wherein the electroconductive film has a sheet resistance of 150.00 Ω/sq or less.

[7] The electroconductive-film-coated substrate according to any one of [1] to [6] wherein the electroconductive film includes at least one element selected from the group consisting of chromium (Cr), tantalum (Ta), silicon (Si), titanium (Ti), zirconium (Zr), hafnium (Hf), and germanium (Ge).

[8] A reflective mask blank including:
the electroconductive-film-coated substrate according to any one of [1] to [7];
a reflective layer for reflecting EUV light disposed on a main surface of the glass substrate of the electroconductive-film-coated substrate on an opposite side from the main surface where the electroconductive film has been disposed; and
an absorption layer for absorbing EUV light disposed over the reflective layer.

Advantageous Effect of Invention

The reflective mask blank of the present invention and the electroconductive-film-coated substrate of the invention for producing the mask blank are effective in inhibiting the generation of particles during electrostatic chucking.

DESCRIPTION OF EMBODIMENTS

Figure 1:
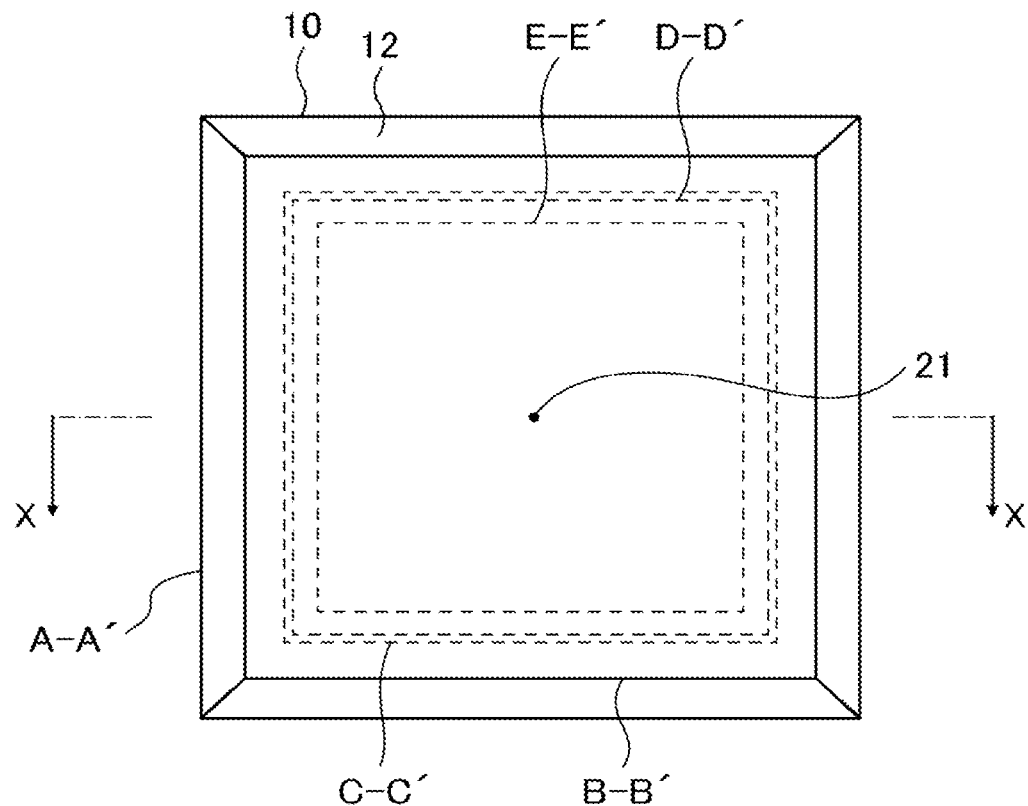
FIG. 1 is a plan view illustrating one embodiment of the electroconductive-film-coated substrate of the present invention.

The electroconductive-film-coated substrate of the present invention is described below by referring to the drawings.

FIG. 1 is a plan view illustrating one embodiment of the electroconductive-film-coated substrate of the present invention. The electroconductive-film-coated substrate illustrated in FIG. 1 includes a glass substrate 10 and an electroconductive film disposed on one main surface of the glass substrate 10. The electroconductive film has been omitted in FIG. 1 for reasons of description.

Figure 2:
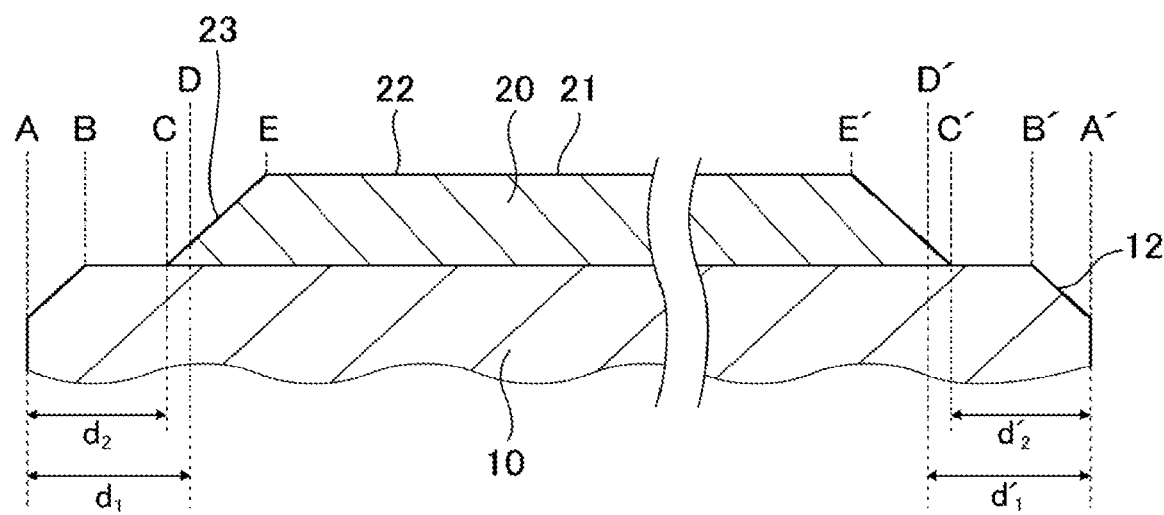
FIG. 2 is a schematic cross-sectional diagram of the electroconductive-film-coated substrate illustrated in FIG. 1.

FIG. 2 is a schematic cross-sectional diagram at the X-X' line of the electroconductive-film-coated substrate illustrated in FIG. 1.

The electroconductive film 20 of the electroconductive-film-coated substrate shown in FIG. 2 has an inclined portion 23 in the peripheral edge thereof.

In this specification, the term "inclined portion 23 of the electroconductive film 20" means a portion where the film thickness of the electroconductive film 20 decreases from a boundary E, E' of a flat portion 22 where the film thickness is approximately constant, specifically, where changes in film thickness from the film thickness at a center 21 of the electroconductive film 20 are within ±2%, toward the end (edge end) C, C' of the electroconductive film 20.

The center 21 of the electroconductive film 20 may be any point which approximately coincide with the center of the main surface of the glass substrate 10. For example, the center 21 may be any point lying at a distance of up to 1 mm from the center of the main surface of the glass substrate 10.

The inclined portion 23 preferably decreases in film thickness gradually toward the end C, C' of the electroconductive film 20, as shown in FIG. 2. The end of the inclined portion 23 is an end of the inclined portion 23 which lies on the side opposite from the flat portion 22, in which the film thickness of the electroconductive film is approximately constant.

The size of the electroconductive film 20 in the electroconductive-film-coated substrate of the present invention varies depending on the dimensions of the glass substrate 10. In the case where the glass substrate 10 is a 152-mm-square glass substrate, the electroconductive film 20 has a size of preferably from a 148-mm square to smaller than a 152-mm square, more preferably from a 150-mm square to smaller than a 152-mm square.

In FIG. 2, an average value of the length of the inclined portion 23, which is represented by the distance between the boundary E, E' of the flat portion 22 and the end C, C' of the electroconductive film 20, is preferably 0.10 to 2.50 mm, more preferably 0.10 to 1.60 mm. In this embodiment, the inclined portion 23 is provided around the entire periphery of the electroconductive film 20, and the average value of the length of the inclined portion 23, which is represented by the distance between the boundary E, E' of the flat portion 22 and the end C, C' of the electroconductive film 20, is, for example, a value determined by measuring the length of the inclined portion 23 at eight points in total lying on the edges of the glass substrate 10 at a distance of 15 mm from the corners thereof and arithmetically averaging the measured values.

In the electroconductive-film-coated substrate of the present invention, the proportion of the length of the inclined portion 23 to the maximum length of the electroconductive film 20 which is represented by the distance between the ends C and C' of the electroconductive film 20 is preferably 1.70% or less, more preferably 1.10% or less. A lower limit of the proportion is 0.07% or higher in many cases.

In the electroconductive-film-coated substrate of the present invention, the distance (d1) from a position D in the inclined portion 23 where the film thickness of the electroconductive film 20 is 10% of the film thickness of the center 21 of the electroconductive film 20 to an edge end A of the glass substrate 10 is 3.00 mm or less, and the distance (d'1) from a position D' in the inclined portion 23 where the film thickness of the electroconductive film 20 is 10% of the film thickness of the center 21 of the electroconductive film 20 to an edge end A' of the glass substrate 10 is 3.00 mm or less. Those distances correspond to the distance from a position where the film thickness of the electroconductive film 20 is 10% of the film thickness of the center 21 of the electroconductive film 20 to a nearest edge end of the glass substrate 10. Hereinafter, the distance (d1) from the position D in the inclined portion 23 where the film thickness of the electroconductive film 20 is 10% of the film thickness of the center 21 of the electroconductive film 20 to the edge end A of the glass substrate 10 and the distance (d'1) from the position D' in the inclined portion 23 where the film thickness of the electroconductive film 20 is 10% of the film thickness of the center 21 of the electroconductive film 20 to the edge end A' of the glass substrate 10 are sometimes inclusively referred to also as the distance (d1) from the position D in the inclined portion 23 to the edge end A of the glass substrate 10. As illustrated in FIG. 2, the distance (d1) from the position D in the inclined portion 23 to the edge end A of the glass substrate 10 is a distance in a direction that is parallel to the main surface of the glass substrate 10.

The portion of the electroconductive film 20 where the thickness of the electroconductive film 20 is 10% of the film thickness of the center 21 of the electroconductive film 20 is a portion which, although lying in the inclined portion 23, has sufficiently high adhesion to the glass substrate 10. So long as the distance (d1) from the position D in the inclined portion 23 of the electroconductive film 20 to the edge end A of the glass substrate 10 is 3.00 mm or less, the position D in the inclined portion 23 of the electroconductive film 20 lies sufficiently close to the periphery of the glass substrate 10. Because of this, it is less likely, during electrostatic chucking, that portions of the inclined portion 23 of the electroconductive film 20 which have small film thicknesses and low adhesion to the glass substrate 10 come into contact with the clamp structure for electrostatic chucking. Consequently, so long as the distance (d1) from the position D in the inclined portion 23 of the electroconductive film 20 to the edge end A of the glass substrate 10 is 3.00 mm or less, then the peeling of the electroconductive film due to vibrations during electrostatic chucking or due to a contact with the clamp structure for electrostatic chucking is less apt to occur.

In the case where the distance from the position D, D' in the inclined portion 23 of the electroconductive film 20 to the edge end A, A' of the glass substrate 10 varies depending on where the position D, D' in the inclined portion 23 lies in the electroconductive-film-coated substrate of the present invention, then a maximum value of the distance from the position D, D' in the inclined portion 23 of the electroconductive film 20 to the edge end A, A' of the glass substrate 10 is 3.00 mm or less.

The distance (maximum distance) from the position D, D' in the inclined portion 23 of the electroconductive film 20 to the edge end A, A' of the glass substrate 10 is preferably 2.50 mm or less, more preferably 1.50 mm or less, still more preferably 1.00 mm or less. A lower limit of that distance is 0.10 mm or larger in many cases.

The electroconductive-film-coated substrate has an inclined portion, which reduces the film stress at the end portion of the electroconductive film compared to the case without an inclined portion (in the case where the thickness of the electroconductive film is constant), thereby suppressing film peeling caused by film stress. When the electroconductive-film-coated substrate has an inclined portion, the angle between the end portion of the electroconductive film and the glass substrate increases to prevent foreign matter such as chemicals during cleaning and particles from remaining in the portion where the end portion of the electroconductive film contacts the glass substrate.

In the electroconductive-film-coated substrate of the present invention, the distance (d2) from the end C of the inclined portion 23 of the electroconductive film 20 to the edge end A of the glass substrate 10 is larger than 0.00 mm, and the distance (d'2) from the end C' of the inclined portion 23 of the electroconductive film 20 to the edge end A' of the glass substrate 10 is larger than 0.00 mm. Those distances correspond to the distance from an end of the inclined portion 23 of the electroconductive film 20 to a nearest edge end of the glass substrate 10. Hereinafter, the distance (d2) from the end C of the inclined portion 23 of the electroconductive film 20 to the edge end A of the glass substrate 10 and the distance (d'2) from the end C' of the inclined portion 23 of the electroconductive film 20 to the edge end A' of the glass substrate 10 are sometimes inclusively referred to also as the distance (d2) from the end C of the inclined portion 23 of the electroconductive film 20 to the edge end A of the glass substrate 10. As illustrated in FIG. 2, the distance (d2) from the end C of the inclined portion 23 of the electroconductive film 20 to the edge end A is a distance in a direction that is parallel to the main surface of the glass substrate 10.

In the case of using the electroconductive-film-coated substrate of the present invention to produce a reflective mask blank, films are formed over both main surfaces of the glass substrate. That is, a reflective multilayer film and an absorption layer are formed over the main surface on the opposite side from the main surface having the electroconductive film formed thereon. Because of this, if film deposition occurs on an edge surface of the glass substrate, conduction might occur between the films respectively formed on both main surfaces of the glass substrate. If conduction has occurred between the films respectively formed on both main surfaces of the glass substrate, electron-beam drawing which is conducted in patterning the reflective mask blank to produce a reflective photomask results in a change in the circuit which is equivalent to that for a transmissive mask blank as an existing technique. It hence might become impossible with an existing electron-beam drawing machine to draw a pattern according to a design. So long as the distance from the end C, C' of the inclined portion 23 of the electroconductive film 20 to the edge end A, A' of the glass substrate 10 is larger than 0.00 mm, no electroconductive film 20 is present on the edge surfaces of the glass substrate 10. Hence, in the case where the electroconductive-film-coated substrate of the present invention is used to produce a reflective mask blank, there is no possibility that conduction might occur between the films respectively formed on both main surfaces of the glass substrate.

In the case where the distance from the end C, C' of the inclined portion 23 of the electroconductive film 20 to the edge end A, A' of the glass substrate 10 varies depending on where the end C, C' of the inclined portion 23 lies in the electroconductive-film-coated substrate of the present invention, then a minimum value of the distance from the end C, C' of the inclined portion 23 of the electroconductive film 20 to the edge end A, A' of the glass substrate 10 is larger than 0.00 mm.

An average value of the distance from the end C, C' of the inclined portion 23 of the electroconductive film 20 to the edge end A, A' of the glass substrate 10 is preferably 2.90 mm or less, more preferably 2.40 mm or less, still more preferably 1.40 mm or less, especially preferably 0.90 mm or less. In this embodiment, the inclined portion 23 is provided around the entire periphery of the electroconductive film 20, and the average value of the distance from the end C, C' of the inclined portion 23 of the electroconductive film 20 to the edge end A, A' of the glass substrate 10 is, for example, a value determined by measuring the distance from the end C, C' of the inclined portion 23 of the electroconductive film 20 to the edge end A, A' of the glass substrate 10 at eight points in total lying on the edges of the glass substrate 10 at a distance of 15 mm from the corners thereof and arithmetically averaging the measured values.

In the case where the glass substrate 10 has a chamfered surface 12 in a peripheral edge portion of the main surface, as in the electroconductive-film-coated substrate shown in FIG. 1 and FIG. 2, at least a part of the end C, C' of the inclined portion preferably lies within the chamfered surface 12. It is more preferred that all of the end C, C' of the inclined portion preferably lies within the chamfered surface 12.

Figure 3:
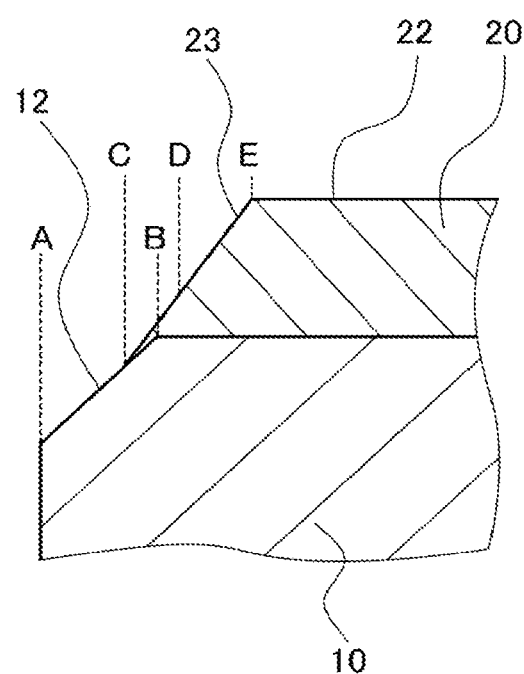
FIG. 3 is an enlarged schematic cross-sectional diagram of a peripheral portion of a glass substrate of one embodiment of the electroconductive-film-coated substrate of the present invention.

This embodiment is explained referring to FIG. 3. FIG. 3 is an enlarged schematic cross-sectional diagram of a peripheral portion of a glass substrate of one embodiment of the electroconductive-film-coated substrate of the present invention. FIG. 3 is a schematic cross-sectional diagram, in which only one edge of the peripheral portion is enlarged. In the electroconductive-film-coated substrate shown in FIG. 3, the glass substrate 10 has a chamfered surface 12 in the periphery portion, and a conductive film is disposed on one main surface of the glass substrate 10. The conductive film 20 has an inclined portion 23 similar to the embodiment described in FIG. 2. In the electroconductive-film-coated substrate shown in FIG. 3, the end C of the inclined portion 23 lies within the chamfered surface 12. In the same manner as described above, the inclined portion 23 is a portion where the film thickness of the electroconductive film 20 decreases from a boundary E of a flat portion 22 where the film thickness is approximately constant, specifically, where changes in film thickness from the film thickness at a center 21 (not shown in FIG. 3) of the electroconductive film 20 are within ±2%, toward the end C of the electroconductive film 20.

In the electroconductive-film-coated substrate shown in FIG. 3, the distance from a position D in the inclined portion 23 where the film thickness of the electroconductive film 20 is 10% of the film thickness of the center 21 (not shown in FIG. 3) of the electroconductive film 20 to an edge end A of the glass substrate 10 is 3.00 mm or less, and the distance from the end C of the inclined portion 23 of the electroconductive film 20 to the edge end A of the glass substrate 10 is larger than 0.00 mm. The preferred range of each of the distances is the same as in the above-described embodiment.

Although FIG. 3 shows an enlarged diagram of the end C of the inclined portion 23 for one edge of the periphery portion of the glass substrate 10, another end C' of the inclined portion 23 preferably also lies within the chamfered surface 12.

In the case where the end C, C' of the inclined portion lies within the chamfered surface 12, the electroconductive film 20 has enhanced adhesion to the glass substrate 10 and is hence less apt to peel off.

In the case where the position D, D' where the film thickness is 10% of the film thickness of the center 21 of the electroconductive film 20 does not lie within the chamfered surface 12 of the glass substrate 10, the electroconductive film 20 is less apt to peel off. Because of this, the position D, D' preferably does not lie within the chamfered surface 12 of the glass substrate 10. In FIG. 3, the position D, D' lies in the main surface of the glass substrate 10.

In the embodiment, the inclined portion 23 is provided around the entire periphery of the electroconductive film 20, and the chamfered surface 12 is provided around the entire periphery portion of the main surface of the glass substrate. Therefore, the above ranges are applicable in the entire periphery of the electroconductive-film-coated substrate.

The electroconductive film 20 of the electroconductive-film-coated substrate of the present invention has a Young's modulus of preferably 50.0 GPa or higher, more preferably 100.0 GPa or higher. An upper limit of the Young's modulus is 400.0 GPa or less in many cases. In the case where the Young's modulus of the electroconductive film 20 is 50.0 GPa or higher, this electroconductive film 20 has excellent surface hardness and is less apt to peel off during electrostatic chucking.

The electroconductive film 20 of the electroconductive-film-coated substrate of the present invention has a sheet resistance of 150.00 Ω/sq or less, more preferably 100.00 Ω/sq or less, still more preferably 30.00 Ω/sq or less. A lower limit of the sheet resistance is 0.10 Ω/sq or higher in many cases. In the case where the sheet resistance is 100.00 Ω/sq or less, the electroconductive-film-coated substrate can be electrostatically chucked without fail.

The electroconductive film 20 of the electroconductive-film-coated substrate of the present invention preferably includes at least one element selected from the group consisting of chromium (Cr), tantalum (Ta), silicon (Si), titanium (Ti), zirconium (Zr), hafnium (Hf), and germanium (Ge). In the case where the electroconductive film 20 includes at least one of these elements, this electroconductive film 20 has a reduced sheet resistance, resulting in an improvement in chucking force during electrostatic chucking.

Specific examples of constituent materials for the electroconductive film 20 including at least one of those elements include CrN, TaB, SiN, TiN, ZrN, HfN, elemental Ge, and elemental Si.

The electroconductive film 20 preferably has a film thickness of 5 nm or larger at the center 21. In the case where the film thickness of the center 21 of the electroconductive film 20 is 5 nm or larger, a sufficient chucking force is attained in electrostatic chucking and there is less possibility of a dielectric breakdown of the glass substrate 10 even when a high voltage is applied in electrostatic chucking. The film thickness of the center 21 is more preferably 10 nm or larger, still more preferably 20 nm or larger.

In the electroconductive film 20, the film thickness of the center 21 is preferably 500 nm or less. In the case where the film thickness of the center 21 of the electroconductive film 20 is 500 nm or less, the electroconductive film 20 can be formed without requiring an increased time and without requiring an increased cost. In addition, since the film thickness of this electroconductive film 20 is not unnecessarily large, the possibility of film peeling does not increase. The film thickness of the center 21 of the electroconductive film 20 is more preferably 450 nm or less, still more preferably 400 nm or less.

The film thickness of the center 21 of the electroconductive film 20 can be measured by a known means, e.g., X-ray reflectometry (XRR), X-ray fluorescence analysis (XRF), section SEM, section TEM, or ellipsometry. Preferred of these, from the standpoint of accuracy, are section SEM and section TEM.

In producing the electroconductive-film-coated substrate of the present invention, the electroconductive film 20 can be formed using a known deposition method, examples of which include dry deposition methods such as: sputtering methods, e.g., a magnetron sputtering method and an ion beam sputtering method; a CVD method; and a vacuum deposition method. For example, in the case of forming a CrN film as the electroconductive film 20, this electroconductive film may be formed by a magnetron sputtering method using a Cr target as a target and an $Ar/N_2$ mixed gas as a sputtering gas. Furthermore, in the case of forming, for example, a TaB film as the electroconductive film 20, this electroconductive film may be formed by a magnetron sputtering method using a TaB compound target and using Ar gas as a sputtering gas.

When depositing the electroconductive film on the chamfered portion with high accuracy, precise control of the deposition equipment may be required. In the case where a film is deposited on a chamfered portion, for example, the substrate holding device described in Japanese Patent Application No. 2021-139521 can be used to hold the glass substrate, enabling precise position adjustment and accurate electroconductive film deposition.

The glass constituting the glass substrate 10 of the electroconductive-film-coated substrate of the present invention preferably has a low coefficient of thermal expansion and has little unevenness in the coefficient. Specifically, a low-thermal-expansion glass having a coefficient of thermal expansion at 20° C. of 600 ppb/° C. or less in terms of absolute value is preferred, an ultralow-thermal-expansion glass having a coefficient of thermal expansion at 20° C. of 400 ppb/° C. or less is more preferred, an ultralow-thermal-expansion glass having a coefficient of thermal expansion at 20° C. of 100 ppb/° C. or less is still more preferred, and an ultralow-thermal-expansion glass having a coefficient of thermal expansion at 20° C. of 30 ppb/° C. or less is especially preferred.

As the low-thermal-expansion glass and ultralow-thermal-expansion glasses, use can be made of glasses including $SiO_2$ as a main component, typically, synthetic silica glasses. Specific examples thereof include a synthetic silica glass including $SiO_2$ as a main component and containing 1 to 12 mass % $TiO_2$.

The size, thickness, etc. of the glass substrate 10 are appropriately determined in accordance with design values, etc. of a reflective mask blank to be produced from the electroconductive-film-coated substrate of the present invention. One example has an outer shape of 152-mm square and a thickness of 6.3 mm. In the case where the glass substrate 10 has the chamfered surface 12, the width of the chamfered surface 12, which is represented by the distance from the edge end A, A' of the glass substrate 10 to the end B, B' of the main surface of the glass substrate 10, varies depending on the dimensions of the glass substrate. In the case of a 152-mm-square glass substrate, the width of the chamfered surface 12 is 0.2 to 0.6 mm.

The reflective mask blank of the present invention includes the electroconductive-film-coated substrate of the present invention, a reflective layer for reflecting EUV light disposed on a main surface of the glass substrate of the electroconductive-film-coated substrate on the opposite side from the main surface where the electroconductive film has been disposed, and an absorption layer for absorbing EUV light disposed over the reflective layer.

The reflective layer is especially required to have the property of being high in EUV light reflectance, which is required of the reflective layers of reflective mask blanks. Specifically, when the surface of the reflective layer is irradiated, at an incident angle of 6°, with EUV light, then the maximum value of the reflectance for light having a wavelength of around 13.5 nm is preferably 60% or more, more preferably 63% or more, still more preferably 65% or more.

Usually used as the reflective layer is a multilayer reflective film formed by alternately stacking a high-refractive-index layer, which has a high EUV light refractive index, and a low-refractive-index layer, which has a low EUV light refractive index, a plurality of times, because this reflective layer can attain a high EUV light reflectance. In the case where the reflective layer is such a multilayer reflective film, Si is widely used as the high-refractive-index layers and Mo is widely used as the low-refractive-index layers. That is, a Mo/Si multilayer reflective film is most common. However, the multilayer reflective film is not limited thereto, and use can be made of a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film, and a Si/Ru/Mo/Ru multilayer reflective film.

The film thickness of each of the layers constituting the multilayer reflective film as the reflective layer and the number of repeating layer units can be appropriately selected in accordance with film materials used and the EUV light reflectance required of the reflective layer. Taking a Mo/Si multilayer reflective film as an example, a reflective layer having a maximum value of EUV light reflectance of 60% or more may be obtained by forming the multilayer reflective film by stacking a Mo layer with a film thickness of $2.3\pm0.1$ nm and a Si layer with a film thickness of $4.5\pm0.1$ nm so that the number of repeating units is 30 to 60.

In the case where the reflective layer is such a multilayer reflective film, the electroconductive-film-coated substrate of the present invention is held by an electrostatic chuck and each of the layers for constituting the multilayer reflective film is deposited in a desired thickness on the main surface of the glass substrate on the opposite side from the main surface having the electroconductive film formed thereon, using a sputtering method such as a magnetron sputtering method or an ion beam sputtering method.

A property particularly required of the absorption layer is an extremely low EUV light ray reflectance. Specifically, when the surface of the absorption layer is irradiated with light rays having wavelengths in a wavelength range of EUV light, then the maximum reflectance for light having a wavelength around 13.5 nm is preferably 5% or less, more preferably 3% or less, especially preferably 1% or less.

In order for the absorption layer to achieve that property, the absorption layer is constituted of a material having a high EUV light absorption coefficient. As the material having a high EUV light absorption coefficient, it is preferred to use a material including tantalum (Ta) as a main component. In this specification, the term "material including tantalum (Ta) as a main component" means a material which includes Ta in an amount of 20 at % or more.

The material including Ta as a main component, which is used as the absorption layer, preferably contains, besides Ta, at least one component selected from among hafnium (Hf), silicon (Si), zirconium (Zr), germanium (Ge), boron (B), palladium (Pd), tin (Sn), chromium (Cr), manganese (Mn), iron (Fe), cobalt (Co), silver (Ag), cadmium (Cd), indium (In), antimony (Sb), tungsten (W), rhenium (Re), osmium (Os), iridium (Ir), platinum (Pt), gold (Au), thallium (Tl), lead (Pd), bismuth (Bi), carbon (C), titanium (Ti), zirconium (Zr), molybdenum (Mo), ruthenium (Ru), rhodium (Rh), palladium (Pd), calcium (Ca), magnesium (Mg), aluminum (Al), nickel (Ni), copper (Cu), zinc (Zn), gallium (Ga), arsenic (As), selenium (Se), tellurium (Te), hydrogen (H), and nitrogen (N). Specific examples of materials containing Ta and any of those other elements include TaN, TaNH, TaHf, TaHfN, TaBSi, TaBSiN, TaB, TaBN, TaSi, TaSiN, TaGe, TaGeN, TaZr, TaZrN, TaPd, TaSn, TaPdN, TaCr, TaMn, TaFe, TaCo, TaAg, TaCd, TaIn, TaSb, and TaW.

The absorption layer having the configuration shown above is deposited on the reflection layer using a sputtering method such as a magnetron sputtering method or an ion beam sputtering method, with the electroconductive film of the electroconductive-film-coated substrate of the present invention being held by an electrostatic chuck.

The film thickness of the absorption layer is preferably 20 to 90 nm.

In the reflective mask blank of the present invention, a protective layer may have been formed between the reflective layer and the absorption layer. The protective layer is provided for the purpose of protecting the reflective layer against a damage by etching when the absorption layer is etched to form a mask pattern therein. Consequently, selected as the material of the protective layer is a substance which is less affected by the etching of the absorption layer, that is, a substance which has a lower etching rate than the absorption layer and is less likely damaged by the etching. Examples of the substance satisfying these requirements include Cr, Al, Ta, nitrides of these, Ru, Ru compounds (RuB, RuSi, etc.), $SiO_2$, $Si_3N_4$, $Al_2O_3$, and mixtures of these.

In the case of forming the protective layer, the thickness thereof is preferably 1 to 60 nm, more preferably 1 to 40 nm.

EXAMPLES

The present invention is described in greater detail below by referring to Examples, but the present invention is not limited to these Examples. Out of Ex. 1 to Ex. 5, Exs. 1 to 4 are Working Examples and Ex. 5 is Comparative Example.

Ex. 1

In Ex. 1, the electroconductive-film-coated substrate shown in FIG. 1 and FIG. 2 was produced.

As a glass substrate 10 for deposition, a $SiO_2$—$TiO_2$-based glass substrate (outer shape, 6-inch (152-mm) square; thickness, 6.3 mm; width of chamfered surface 12, 0.4 mm) was used.

Next, a CrN film was formed as an electroconductive film 20 on one main surface of the glass substrate 10 by a magnetron sputtering method, thereby producing the electroconductive-film-coated substrate shown in FIG. 1 and FIG. 2. In forming the CrN film, a Cr target was used and an Ar/$N_2$ mixed gas was used as a sputtering gas.

In order to form the CrN film in a restricted region, the substrate holding device described in Japanese Patent Application No. 2021-139521 is used to hold the substrate 10, and a shielding member having an opening with a given size was disposed over the glass substrate 10 at a given distance from the glass substrate.

In the produced electroconductive-film-coated substrate, the electroconductive film 20 had an inclined portion 23 in the end portion. The maximum value of the distance from the position D, D' in the inclined portion 23 where the film thickness was 10% of the film thickness of the center 21 of the electroconductive film 20 to the edge end A, A' of the glass substrate 10 was 2.85 mm, and the distance from the end C, C' of the inclined portion 23 of the electroconductive film 20 to the edge end A, A' of the glass substrate 10 was larger than 0 mm. The end C, C' of the inclined portion 23 of the electroconductive film 20 did not lie within the chamfered surface of the glass substrate 10. The inclined portion 23 gradually decreased in film thickness toward the end C, C' thereof.

An average value of the distance between the ends C and C' of the inclined portion 23, which represents the length of the electroconductive film 20, was 149.90 mm. An average value of the distance between the end C, C' of the inclined portion 23 and the edge end A, A' of the glass substrate was 1.05 mm. An average value of the distance between the boundary E, E' of the flat portion 22 and the end C, C' of the inclined portion 23, which represents the length of the inclined portion 23, was 2.50 mm. These average values were each obtained by making a measurement at eight points in total lying on the edges of the glass substrate 10 at a distance of 15 mm from the corners thereof and arithmetically averaging the measured values.

The electroconductive film 20 was examined for Young's modulus with iMicro (KLA Corp.). As a result, the Young's modulus of the electroconductive film 20 was found to be 242.3 GPa.

The electroconductive film 20 was examined for sheet resistance with Loresta-GX (Nittoseiko Analytech Co., Ltd.). As a result, the sheet resistance of the electroconductive film 20 was found to be 2.61 Ω/sq.

The electroconductive film 20 of the produced electroconductive-film-coated substrate was adhered to the chucking surface of an electrostatic chuck, and this electroconductive-film-coated substrate was held in a vacuum for 2 hours while the electrostatic chuck was kept rotating at 30 rpm. In the electrostatic chuck, the chucking surface had a circular shape and the distance between outermost electrodes was 141.5 mm. The voltage applied between the electrodes of the electrostatic chuck was 1,200 V.

By the procedure shown above, six electroconductive-film-coated substrates were produced. The produced electroconductive-film-coated substrates were each examined for the number of defects before and after the holding by the electrostatic chuck, using a defect detector. Specifically, a 146-mm-square inspection area in that surface of the electroconductive-film-coated substrate where the electroconductive film had been formed was examined to determine the number of defects having a size of 100 to 150 nm (number of defects). The difference in the number of defects between before and after the holding by the electrostatic chuck was determined, and an average value for the six electroconductive-film-coated substrates was shown as the number of defects in 146-mm-square inspection area. In the case where the number of defects in 146-mm-square inspection area is 15 or less, the generation of particles during the electrostatic chucking was little.

Ex. 2 and Ex. 3

Electroconductive-film-coated substrates were produced by the same procedure as in Ex. 1, except that the size of the opening of the shielding member and the distance between the shielding member and the glass substrate were changed. In each of the produced electroconductive-film-coated substrates, the electroconductive film 20 had an inclined portion 23 in the end portion. The maximum value of the distance from the position D, D' in the inclined portion 23 where the film thickness was 10% of the film thickness of the center 21 of the electroconductive film 20 to the edge end A, A' of the glass substrate 10 was as shown in the table given later, and the distance from the end C, C' of the inclined portion 23 of the electroconductive film 20 to the edge end A, A' of the glass substrate 10 was larger than 0 mm. The end C, C' of the inclined portion 23 of the electroconductive film 20 lay within the chamfered surface of the glass substrate 10.

An average value of the distance between the ends C and C', an average value of the distance between the end C, C' and the edge end A, A', an average value of the distance between the boundary E, E' and the end C, C', and the Young's modulus and sheet resistance of the electroconductive film 20 were as shown in the table given later.

Six such electroconductive-film-coated substrates were produced in each Ex. and examined for the number of defects before and after the adhesion holding by the electrostatic chuck. An average value of the difference in the number of defects between before and after the holding by the electrostatic chuck for the six electroconductive-film-coated substrates was shown as the number of defects in 146-mm-square inspection area. The results are shown in the table.

Ex. 4

An electroconductive-film-coated substrate was produced by the same procedure as in Ex. 1, except that a TaB compound target and Ar gas as a sputtering gas were used to form a TaB film as an electroconductive film 20 on one main surface of the glass substrate 10 and that the size of the opening of the shielding member and the distance between the shielding member and the glass substrate were changed. In the electroconductive-film-coated substrate, the electroconductive film 20 had an inclined portion 23 in the end portion. The maximum value of the distance from the position D, D' in the inclined portion 23 where the film thickness was 10% of the film thickness of the center 21 of the electroconductive film 20 to the edge end A, A' of the glass substrate 10 was as shown in the table given later, and the distance from the end C, C' of the inclined portion 23 of the electroconductive film 20 to the edge end A, A' of the glass substrate 10 was larger than 0 mm. The end C, C' of the inclined portion 23 of the electroconductive film 20 lay within the chamfered surface of the glass substrate 10.

An average value of the distance between the ends C and C', an average value of the distance between the end C, C' and the edge end A, A', an average value of the distance between the boundary E, E' and the end C, C', and the Young's modulus and sheet resistance of the electroconductive film 20 were as shown in the table given later.

Six such electroconductive-film-coated substrates were produced and examined for the number of defects before and after the adhesion holding by the electrostatic chuck. An average value of the difference in the number of defects between before and after the holding by the electrostatic chuck for the six electroconductive-film-coated substrates was shown as the number of defects in 146-mm-square inspection area. The results are shown in the table.

Ex. 5

An electroconductive-film-coated substrate was produced by the same procedure as in Ex. 1, except that the size of the opening of the shielding member and the distance between the shielding member and the glass substrate were changed. In the produced electroconductive-film-coated substrate, the electroconductive film 20 had an inclined portion 23 in the end portion. The maximum value of the distance from the position D, D' in the inclined portion 23 where the film thickness was 10% of the film thickness of the center 21 of the electroconductive film 20 to the edge end A, A' of the glass substrate 10 was as shown in the table given later, and the distance from the end C, C' of the inclined portion 23 of the electroconductive film 20 to the edge end A, A' of the glass substrate 10 was larger than 0 mm. The end C, C' of the inclined portion 23 of the electroconductive film 20 did not lie within the chamfered surface of the glass substrate 10.

An average value of the distance between the ends C and C', an average value of the distance between the end C, C' and the edge end A, A', an average value of the distance between the boundary E, E' and the end C, C', and the Young's modulus and sheet resistance of the electroconductive film 20 were as shown in the table given later.

Six such electroconductive-film-coated substrates were produced and examined for the number of defects before and after the adhesion holding by the electrostatic chuck. An average value of the difference in the number of defects between before and after the holding by the electrostatic chuck for the six electroconductive-film-coated substrates was shown as the number of defects in 146-mm-square inspection area. The results are shown in the table.

TABLE 1

|  | Ex. 1 | Ex. 2 | Ex. 3 | Ex. 4 | Ex. 5 |
| --- | --- | --- | --- | --- | --- |
| Electroconductive film | CrN film | CrN film | CrN film | TaB film | CrN film |
| Maximum value of distance between position D, D' and edge end A, A' [mm] | 2.85 | 0.47 | 0.50 | 0.47 | 3.20 |
| Minimum value of distance between end C, C' and edge end A, A' exceeds 0 mm? | yes | yes | yes | yes | yes |
| End C, C' lies within chamfered surface? | no | yes | yes | yes | no |
| Average value of distance between ends C and C' [mm] | 149.90 | 151.30 | 151.80 | 151.30 | 149.50 |

TABLE 1-continued

|  | Ex. 1 | Ex. 2 | Ex. 3 | Ex. 4 | Ex. 5 |
|---|---|---|---|---|---|
| Average value of distance between end C, C' and edge end A, A' [mm] | 1.05 | 0.35 | 0.10 | 0.35 | 1.25 |
| Average value of distance between boundary E, E' and end C, C' [mm] | 2.50 | 0.80 | 0.75 | 0.80 | 2.50 |
| Young's modulus [GPa] | 242.3 | 242.3 | 242.3 | 107.3 | 242.3 |
| Sheet resistance [Ω/sq] | 2.61 | 2.61 | 2.61 | 40.74 | 2.61 |
| Number of defects in 146-mm-square inspection area | 13.2 | 10 | 9.8 | 9.5 | 16.3 |

Ex. 1 to Ex. 4, in each of which the maximum value of the distance from the position D, D' in the inclined portion 23 where the film thickness was 10% of the film thickness of the center 21 of the electroconductive film 20 to the edge end A, A' of the glass substrate 10 was 3.00 mm or less and the distance from the end C, C' of the inclined portion 23 of the electroconductive film 20 to the edge end A, A' of the glass substrate 10 was larger than 0.00 mm, each gave such results that the number of defects in 146-mm-square inspection area was 15.0 or less and particle generation during the electrostatic chucking had been inhibited. In Ex. 2 to Ex. 4, in which the end C, C' of the inclined portion 23 of the electroconductive film 20 lay within the chamfer of the glass substrate 10, the number of defects in 146-mm-square inspection area was 10.0 or less and particle generation during the electrostatic chucking had been more inhibited, and it is considered that defects caused by particles were suppressed. Ex. 5, in which the maximum value of the distance from the position D, D' in the inclined portion 23 where the film thickness was 10% of the film thickness of the center 21 of the electroconductive film 20 to the edge end A, A' of the glass substrate 10 was larger than 3.00 mm, gave such results that the number of defects in 146-mm-square inspection area was larger than 15.0, and it is considered that considerable particle generation had occurred during the electrostatic chucking.

While the present invention has been described in detail and with reference to specific embodiments thereof, it will be apparent to one skilled in the art that various changes and modifications can be made therein without departing from the spirit and scope thereof.

This application is based on Japanese Patent Applications No. 2021-089510 filed on May 27, 2021, No. 2021-139521 filed on Aug. 30, 2021, and No. 2022-071912 filed on Apr. 25, 2022, the entire subject matter of which is incorporated herein by reference.

REFERENCE SINGS LIST

10: Glass substrate
12: Chamfered surface
20: Electroconductive film
21: Center
22: Flat portion
23: Inclined portion

The invention claimed is:

1. A reflective mask blank comprising:
    a glass substrate including a chamfered surface in a peripheral edge portion of the main surface;
    an electroconductive film disposed on one main surface of the glass substrate;
    a reflective layer for reflecting EUV light disposed on a main surface of the glass substrate of the electroconductive-film-coated substrate on an opposite side from the main surface where the electroconductive film has been disposed; and
    an absorption layer for absorbing EUV light disposed over the reflective layer,
    wherein the electroconductive film comprises an inclined portion in a peripheral edge,
    a distance from a position in the inclined portion where a thickness of the electroconductive film is 10% of a film thickness of a center of the electroconductive film to an edge end of the glass substrate is 3.00 mm or less,
    a distance from an end of the inclined portion to the edge end of the glass substrate is longer than 0.00 mm, and
    at least a part of the end of the inclined portion lies within the chamfered surface.

2. The reflective mask blank of claim 1, wherein all of the end of the inclined portion lies within the chamfered surface.

3. The reflective mask blank of claim 1, wherein the position in the inclined portion where the thickness of the electroconductive film is 10% of the film thickness of the center of the electroconductive film does not lie within the chamfered surface.

4. The reflective mask blank of claim 1, wherein the electroconductive film has a Young's modulus of 50.0 GPa or higher.

5. The reflective mask blank of claim 1, wherein the electroconductive film has a sheet resistance of 150.00 Ω/sq or less.

6. The reflective mask blank of claim 1, wherein the electroconductive film comprises at least one element selected from the group consisting of chromium (Cr), tantalum (Ta), silicon (Si), titanium (Ti), zirconium (Zr), hafnium (Hf), and germanium (Ge).

* * * * *